United States Patent
Hao et al.

(10) Patent No.: US 8,980,648 B1
(45) Date of Patent: Mar. 17, 2015

(54) SEMICONDUCTOR GALLIUM ARSENIDE COMPATIBLE EPITAXIAL FERROELECTRIC DEVICES FOR MICROWAVE TUNABLE APPLICATION

(71) Applicant: The Hong Kong Polytechnic University, Hong Kong (HK)

(72) Inventors: Jianhua Hao, Hong Kong (HK); Wen Huang, Hong Kong (HK); Zhibin Yang, Hong Kong (HK)

(73) Assignee: The Hong Kong Polytechnic University, Hunghom, Kowloon (HK)

( * ) Notice: Subject to any disclaimer, the term of this patent is extended or adjusted under 35 U.S.C. 154(b) by 29 days.

(21) Appl. No.: 13/975,380

(22) Filed: Aug. 26, 2013

(51) Int. Cl.
- H01L 21/00 (2006.01)
- H01L 21/02 (2006.01)
- H01L 29/205 (2006.01)

(52) U.S. Cl.
CPC ........ H01L 21/02631 (2013.01); H01L 29/205 (2013.01)
USPC ................................ 438/3; 438/779; 257/295

(58) Field of Classification Search
USPC ........................................ 257/295; 438/3, 779
See application file for complete search history.

(56) References Cited

U.S. PATENT DOCUMENTS

| | | | | |
|---|---|---|---|---|
| 6,570,464 | B1 * | 5/2003 | Tanabe et al. | 333/34 |
| 2004/0157357 | A1 * | 8/2004 | Liang et al. | 438/90 |
| 2008/0044673 | A1 * | 2/2008 | Miyamoto et al. | 428/469 |

OTHER PUBLICATIONS

Yanrong Li, et al. Study of the Integrated Growth of Dielectric Films on GaN Semiconductor Substrates, IEEE Transactions on Ultrasonics, Ferroelectrics, and Frequency Control, vol. 57, No. 10, Oct. 2010.
Ruguan Li, et al. Tunable Capacitors Employing BZN/BST Thin Films for RF Applications, IEEE Transactions on Ultrasonics, Ferroelectrics, and Frequency Control, vol. 58, No. 6, Jun. 2011.
Ming Liu, et al. Microwave Dielectric Properties with Optimized Mn-Doped Ba0.6Sr0.4TiO3 Highly Epitaxial Thin Films, Crystal Growth & Design Communication, 2010, vol. 10, 4221-4223.
Z. P. Wu, et al. Photocarrier injection and photo-resistance in SrTiO3-δ/GaAsp-n junctions, Europhysics Letters, vol. 100, Dec. 2012, 57003.
G. Z. Liu, et al. Stoichiometry of SrTiO3 films grown by pulsed laser deposition, Applied Physics Letters 100, 202902 (2012).
Zhibin Yang, et al, In-plane dielectric properties of epitaxial Ba0.7Sr0.3TiO3 thin films grown on GaAs for tunable device application, Journal of Applied Physics 112, 054110 (2012).

* cited by examiner

*Primary Examiner* — Trung Q Dang
(74) *Attorney, Agent, or Firm* — Ella Cheong Hong Kong; Sam T. Yip

(57) ABSTRACT

The presently claimed invention provides a barium strontium titanate/strontium titanate/gallium arsenide (BST/STO/GaAs) heterostructure comprising a gallium arsenide (GaAs) substrate, at least one strontium titanate (STO) layer, and at least one barium strontium titanate (BST) layer. The BST/STO/GaAs heterostructure of the present invention has a good temperature stability, high dielectric constant and low dielectric loss, which enable to fabricate tunable ferroelectric devices. A method for fabricating the BST/STO/GaAs heterostructure is also disclosed in the present invention, which comprises formation of at least one STO layer on the GaAs substrate by a first laser molecular beam epitaxial system, and formation of at least one BST layer on the STO layer by a second laser molecular beam epitaxial system.

20 Claims, 10 Drawing Sheets

SEMICONDUCTOR GALLIUM ARSENIDE COMPATIBLE EPITAXIAL FERROELECTRIC DEVICES FOR MICROWAVE TUNABLE APPLICATION

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION:

The present invention relates generally to a highly epitaxial barium strontium titanate/strontium titanate/gallium arsenide (BST/STO/GaAs) heterostructure, and a method for fabricating the epitaxial heterostructure, and more specifically, the present invention relates to a BST/STO/GaAs heterostructure, which is used for tunable ferroelectric devices.

TECHNICAL BACKGROUND:

Ferroelectric oxides are very attractive materials with unique chemical and physical properties, which can be used for a variety of devices. Among these devices, frequency and phase agile microwave devices have widespread applications. For electric-field tuning, barium strontium titanate ($Ba_{1-x}Sr_xTiO_3$) is commonly used since its Curie temperature depends on the barium/strontium (Ba/Sr) ratio, and can be easily adjusted from 40 K for strontium titanate, $SrTiO_3$ (STO) to 398 K for pure barium titanate, $BaTiO_3$. The high dielectric constant, low dielectric loss, and dielectric nonlinearity are the materials parameters that enable such applications. To date, the fabrication of titanate based tunable devices has been well done on single-crystal oxide substrates such as magnesium oxide, MgO and lanthanum aluminate, $LaAlO_3$ (LAO). See for example: *M. Liu et al., Crystal Growth & Design Communication*, Vol. 10, pp. 4221-4223 (2010).

However, the problems are the high cost of the substrates and the fact that oxide substrates of MgO and LAO are only available in small geometries, which are not suitable for mass production. Additionally, the use of oxide substrates, preferably, requires mounting complicated hybrid microwave integrated circuits. Therefore, there is a great interest to combine the frequency agile electronics of ferroelectric titanates directly with the high-performance microwave capabilities of gallium arsenide (GaAs).

GaAs has a zincblende structure and higher saturated electron mobility compared to silicon (Si). Devices based on GaAs could function at much higher frequency. This interest is also driven by the affordability and large-size availability of commercial GaAs wafers. Obviously, fabrication of highly-epitaxial heterostructures is the first step in the realization of new integrated devices. Compared to the growth of perovskite titanates on Si, there is limited work on the titanate oxide/III-V's heteroepitaxial structures while many properties and functionalities of such heterostructures are expected.

Among these perovskite oxides, the $Ba_{1-x}Sr_xTiO_3$ film on GaAs substrate has been fabricated by complex deposition system including metal-organic chemical vapor deposition (MOCVD) and molecular beam epitaxy (MBE). Nevertheless, the thin films deposited by these techniques are usually amorphous and polycrystalline which have a lot of defects and are hardly applied in the semiconductor devices. The epitaxial growth of these oxides on GaAs is rather challenging, since GaAs is neither chemically stable nor thermally stable. GaAs is frequently oxidized to form low quality surface oxides in order to compromise the interface quality, and GaAs starts to lose As over 400° C. In order to achieve successful deposition of epitaxial perovskite oxides, a single and/or multi-buffer layer usually should be grown firstly.

To date, there is no work on the tunable microwave device application using epitaxial ferroelectric thin films grown on GaAs. These ferroelectric thin-films are usually non-epitaxal, i.e. polycrystalline or amorphous. So far, no similar products integrating ferroelectric devices with GaAs exist in the market. Therefore, it is of particular importance to select a proper buffer and find a new method to fabricate epitaxial ferroelectric thin-film devices which are integrated with GaAs, such that the devices can have better performance compared to the conventional polycrystalline or amorphous based devices.

SUMMARY OF THE INVENTION:

Accordingly, the first aspect of the presently claimed invention is to provide a barium strontium titanate/strontium titanate/gallium arsenide heterostructure for tunable ferroelectric devices. The heterostructure of the present invention comprises a gallium arsenide (GaAs) substrate, at least one layer of strontium titanate, $SrTiO_3$ (STO), which is grown on a surface of the gallium arsenide substrate, and at least one layer of barium strontium titanate, $Ba_{1-x}Sr_xTiO_3$ (BST), which is grown on top of the layer of STO in order to form an epitaxial BST/STO/GaAs heterostructure useful in fabrication of tunable ferroelectric devices. The highly epitaxial BST/STO/GaAs heterostructure of the present invention has many advantages including good temperature stability, high dielectric constant and low dielectric loss, which are important factors for fabricating tunable ferroelectric devices.

The second aspect of the presently claimed invention is to provide a method for fabricating the BST/STO/GaAs heterostructure of the present invention. The method of the present invention comprises the steps of providing a GaAs substrate, growing at least one layer of STO on a surface of the GaAs substrate, and growing at least one layer of BST on top of the layer of STO. The formation of the at least one layer of STO and at least one layer of BST is performed by a laser molecular beam epitaxial (MBE) system.

The third aspect of the presently claimed invention is to provide tunable ferroelectric devices comprising the BST/STO/GaAs heterostructure of the present invention. The ferroelectric devices include microwave varactor, phase shifter, ferroelectric capacitor, and interdigital capacitor electrode. Furthermore, the BST/STO/GaAs heterostructure of the present invention can be used to fabricate monolithic microwave integrated circuit.

BRIEF DESCRIPTION OF THE DRAWINGS:

Embodiments of the present invention are described in more detail hereinafter with reference to the drawings, in which.

DETAILED DESCRIPTION OF PREFERRED EMBODIMENTS:

In the following description, several BST/STO/GaAs heterostructures and methods for fabricating the BST/STO/GaAs heterostructure thereof are set forth as preferred examples. It will be apparent to those skilled in the art that modifications, including additions and/or substitutions maybe made without departing from the scope and spirit of the invention. Specific details may be omitted so as not to obscure the invention; however, the disclosure is written to enable one skilled in the art to practice the teachings herein without undue experimentation.

Figure 1:
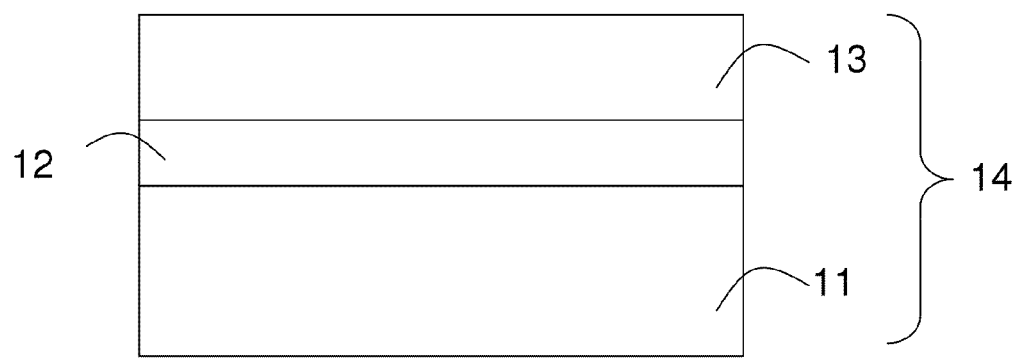
FIG. 1 shows an epitaxial BST/STO/GaAs heterostructure according to one embodiment of the presently claimed invention.

FIG. 1 shows a BST/STO/GaAs heterostructure according to one embodiment of the presently claimed invention. The BST/STO/GaAs heterostructure of the present invention comprises a GaAs substrate 11, a layer of strontium titanate (STO) 12 grown on a surface of the GaAs substrate 11, and a layer of barium strontium titanate (BST) 13 grown on top of the layer of STO 12 in order to form an epitaxial BST/STO/GaAs heterostructure 14.

The layer of STO 12 serves as a buffer layer in the presently claimed invention. The reasons of using STO as the buffer layer because it has a cubic perovskite structure which results in a relatively large dielectric constant and a lattice parameter that is closely matched with a large number of functional materials. By incorporation of the layer of STO into the BST/STO/GaAs heterostructure of the present invention, the electrical properties of functional oxides grown on STO buffered GaAs substrate are significantly improved because of having smaller lattice strain between the substrate and the functional oxide layer. The problem of interdiffusion and surface oxidation is solved by using a unique buffer layer grown on GaAs substrate before the deposition of BST layer. By selecting the proper buffer layer made of STO, the interdiffusion and surface oxidation can be significantly suppressed and the lattice mismatch between BST and GaAs can be decreased from 45% to 5% because of a specific angle of 45° in-plane rotation of the STO layer formed on GaAs surface. Consequently, the incorporation of STO layer into the BST/STO/GaAs heterostrucutre of the present invention is a key factor in providing high-quality epitaxial BST layer having moncrystalline structure.

According to various embodiments of the presently claimed invention, the GaAs substrate can be a GaAs wafer. Furthermore, the STO layer is epitaxially grown on the GaAs substrate, leading to be monocrystalline. The range of thickness of the STO layer is from 3 nm to 25 nm The layer of STO can be formed with a 45° in-plane rotation on the GaAs substrate to get a comfortable lattice match due to a large mismatch between the STO layer (a=3.905 Å) and GaAs substrate (a=5.65 Å). It means that there are fewer cracks remaining on the surface of the STO layer during fabrication. The BST layer is epitaxially grown on the STO layer, leading to be monocrystalline. Preferably, the range of thickness of the BST layer is from 200 nm to 500 nm The value of x in $Ba_{1-x}Sr_xTiO_3$ is from 0.3 to 0.5. Preferably, the in-plane layer-substrate orientation is [100]BST||[100]STO||[110]GaAs, and the out-of-plane layer-substrate orientation is [001]BST||[001]STO||[001]GaAs.

Figure 2:
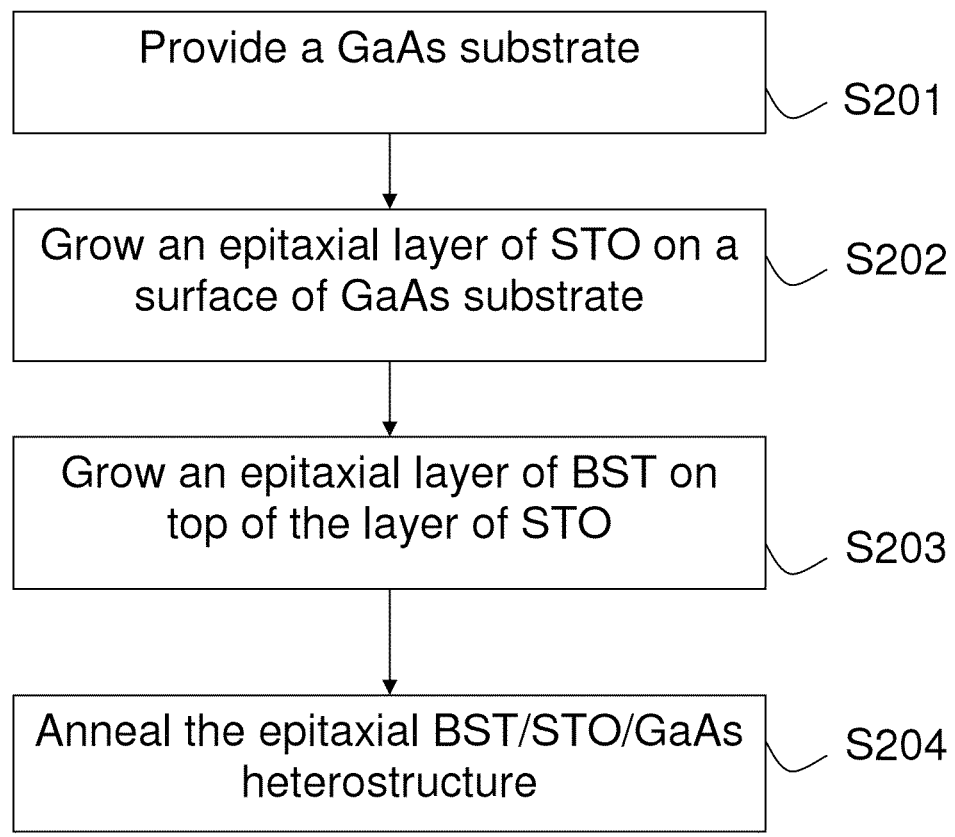
FIG. 2 shows a process flow diagram illustrating a method for fabricating a BST/STO/GaAs heterostructure according to one embodiment of the presently claimed invention.

FIG. 2 shows a process flow diagram illustrating a method for fabricating the BST/STO/GaAs heterostructure according to one embodiment of the presently claimed invention. In step 201, a GaAs substrate is provided. In step 202, a monocrystalline layer of STO is grown epitaxially on a surface of the GaAs substrate by a first laser molecular beam epitaxial (MBE) system. In step 203, a monocrystalline layer of BST is grown epitaxially on top of the layer of STO by a second laser MBE system. In step 204, the formed epitaxial BST/STO/GaAs heterostructure is annealed.

In step 202, the first laser MBE system used is an oxygen ($O_2$) flowing pulsed laser MBE system with an operation wavelength of KrF (λ=248 nm) which is used for forming the layer of STO. Ceramic STO is used as a target. The chamber of the first MBE system is evacuated to a base pressure with a range of $1-5\times10^{-5}$ Pa. The deposition temperature is set in the range of 580° C. to 600° C. for the STO layer grown on the GaAs substrate. The preferable range of oxygen partial pressure during STO layer deposition is $1-5\times10^{-5}$ Pa. The growth rate for the STO layer is 3-5 nm/min.

In step 203, the second laser MBE system is an oxygen flowing pulsed laser MBE system with an operation wavelength of KrF (λ=248 nm) which is used for forming the layer of BST on the top of the layer of STO. Ceramic BST is used as a target. The chamber is evacuated to a base pressure with a range of $1-5\times10^{-5}$ Pa. The deposition temperature is set in the range of 620-650° C. for the BST layer grown on the top of the STO layer. The preferable range of oxygen partial pressure during BST layer deposition is 1-20 Pa. The growth rate for STO layer is 5-10 nm/min.

In step 204, the BST/STO/GaAs heterostructure is then annealed. A preferable range of annealing time is 30-90 min Also, the preferable range of oxygen partial pressure is 100-300 Pa.

According to experimental results, well control of the temperature and the oxygen partial pressure during the formation of the STO layer and BST layer in the laser MBE system are the key factors to provide the high-quality epitaxial BST layer having monocrystalline structure.

In accordance with a first exemplary embodiment of the presently claimed invention, a BST/STO/GaAs heterostructure is formed by the below method. A layer of BST is deposited on STO buffered high resistivity GaAs (001) substrate ($\rho > 1 \times 10^6$ Ωm) by $O_2$ flowing pulsed laser MBE system with an operation wavelength of KrF($\lambda$=248 nm). Ceramic STO is used as a target. The distance between the ceramic STO target and the GaAs substrate is 5 cm. The deposition temperature is set at 600° C. for STO layer grown on the GaAs substrate. To prevent the oxidation of GaAs occurring, the chamber is evacuated to a base pressure of $5 \times 10^{-5}$ Pa during the STO layer deposition. The deposition time is 10 min when the laser repetition rate is kept at 1 Hz, resulting in a 10 nm thick STO layer. After that, the STO/GaAs is heated up to 620° C., and the oxygen partial pressure is fixed at 1 Pa for the subsequent BST layer deposition. A ceramic BST target with formula $Ba_{0.7}Sr_{0.3}TiO_3$ is used so as to form a $Ba_{0.7}Sr_{0.3}TiO_3$ layer later on. A relatively smaller oxygen partial pressure used herein is to avoid possible oxidation of GaAs, which can decrease the crystallinity of the heterostructure. The deposition time is 1hr, and the laser repetition rate is 5 Hz. The thickness of the BST layer is 300 nm After deposition, the BST/STO/GaAs heterostructure is then in situ annealed in ambient of 200 Pa oxygen partial pressure for 1 h before being cooled down to room temperature in order to reduce the oxygen vacancies.

Figure 3:
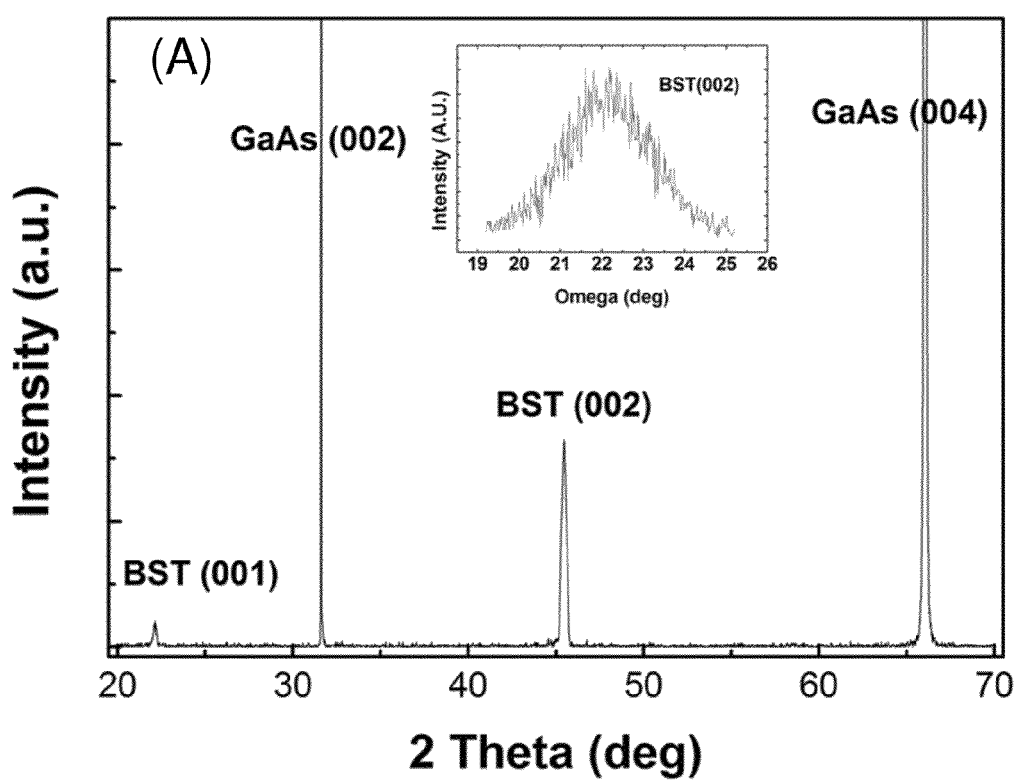
FIG. 3A shows a θ2 θXRD scan of a highly epitaxial BST/STO/GaAs heterostructure according to a first exemplary embodiment of the presently claimed invention.
FIG. 3B shows the off-axis φ scans of the layer of BST and GaAs substrate of the BST/STO/GaAs heterostructure according to the first exemplary embodiment of the presently claimed invention.
FIG. 3C shows an atomic force microscopy (AFM) image taken from the surface of the layer of BST of the BST/STO/GaAs heterostructure according to the first exemplary embodiment of the presently claimed invention.
Figure 3:
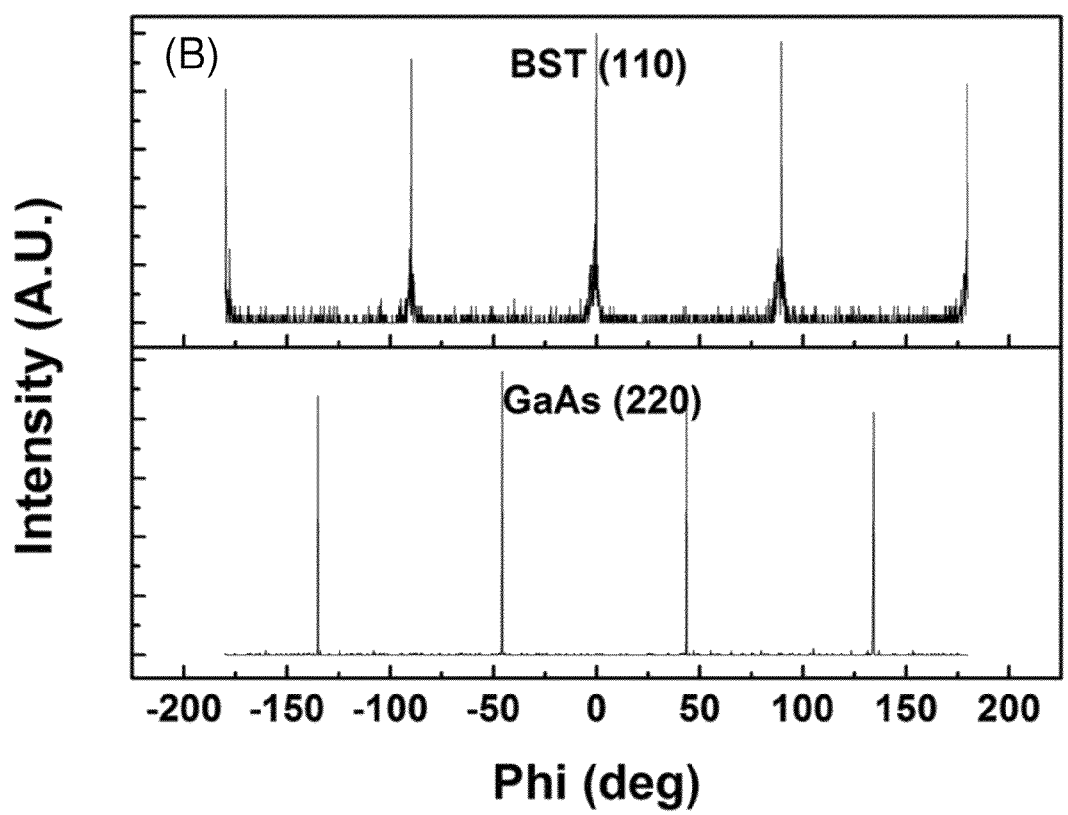
Figure 3:
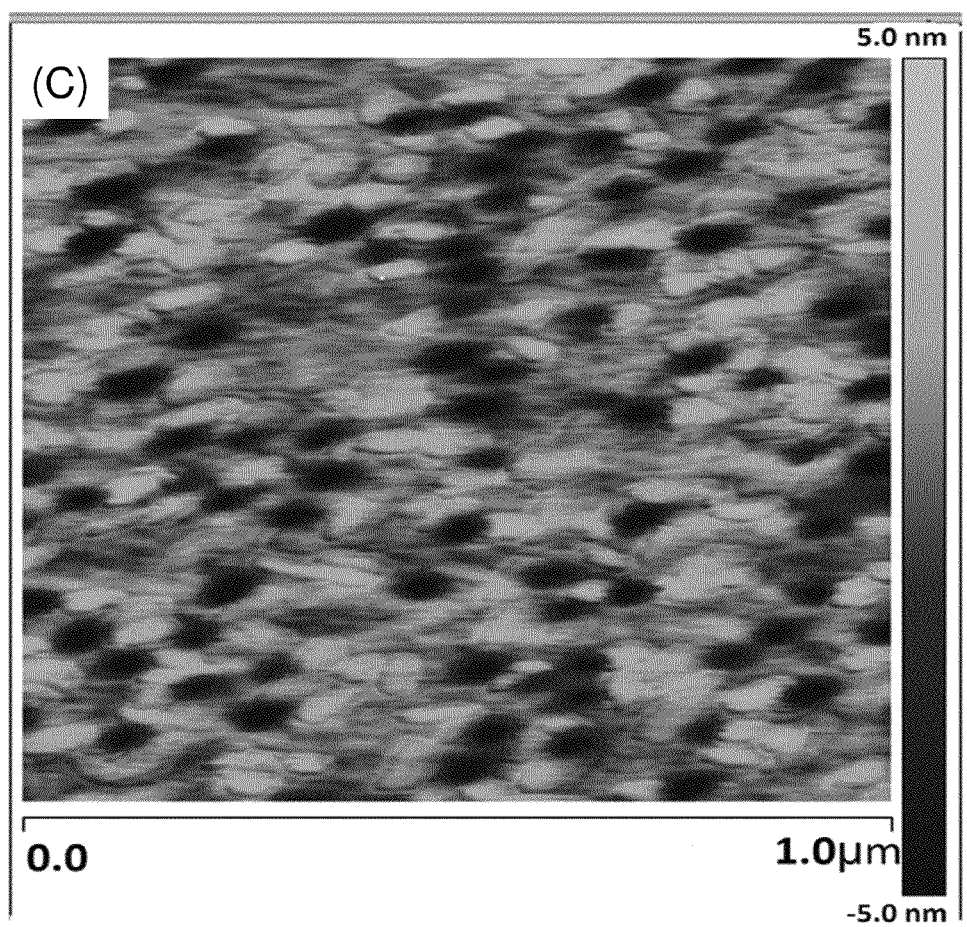

FIG. 3A shows a θ-2θ XRD scan of the heterostructure according to the first exemplary embodiment of the presently claimed invention. As observed from FIG. 3A, only (001) peaks of the BST appear in the diffraction patterns besides the peaks from the GaAs substrate. It suggests that the BST layer has a single perovskite phase and is highly oriented along c-axis. Due to the small thickness of the STO layer, obvious peaks corresponding to STO cannot be found in FIG. 3A. Rocking curve measurements indicate a full width at half maximum (FWHM) value of 1.1° in the inset of FIG. 3A. This value is larger than that of the previously reported BST films on single-crystal substrates. For example, the FWHM values of BST layer grown on MgO substrates and LAO substrates are around 0.54° and 0.15°, respectively. At room temperature, the lattice parameters for the bulk BST are a=b=c=3.965 Å. Calculation based on FIG. 3A results in c-axis lattice constants of 3.992 Å and 5.653 Å for BST layer and GaAs substrate, respectively. It is observed that the lattice parameter of BST layer is slightly larger than that of bulk BST, which suggests that the BST layer is suffered from a compressive strain caused by the lattice mismatch between BST and the underlying cubic STO buffer layer (a=3.903 Å).

In FIG. 3B, the off-axis φ scans of the BST layer and GaAs substrate are presented, in which the (110) diffraction peak is used for the BST layer. Only four peaks, 90° apart, are shown for the BST layer, which are at the same angles with the GaAs substrate. The measured results indicate that the BST layer is epitaxially grown on the (001) surface of STO layer and has an in-plane layer-substrate orientation relationship of [100] BST||[100]STO||[110]GaAs.

FIG. 3C shows an atomic force microscopy (AFM) image taken from the surface of the BST layer that confirms the high quality structure of the BST layer. The as grown layer has very smooth surface with a root-mean square roughness values of 1.60 nm from the AFM measurement. Such good surface makes the BST layer suitable for fabricating devices with in-plane electrodes.

Figure 4:
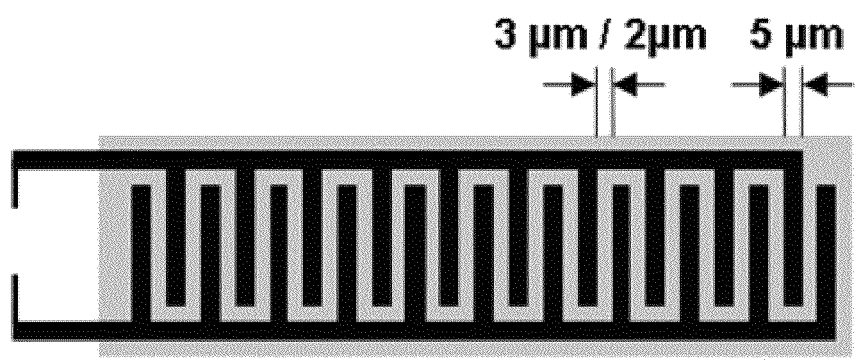
FIG. 4 shows a pattern of inter-digital electrodes according to the first exemplary embodiment of the presently claimed invention.

In order to conduct dielectric constant measurement, interdigital electrodes (IDE) are formed on the surface of the BST layer by photolithography. As shown in the FIG. 4, the pattern of the IDE possesses a total of 21 fingers with a finger length of 925 μm, a finger width of 5 μm, and a finger gap of 2 μm. During the measurement, the directing current (DC) and alternating current (AC) bias signal are applied on these electrodes simultaneously.

Figure 5:
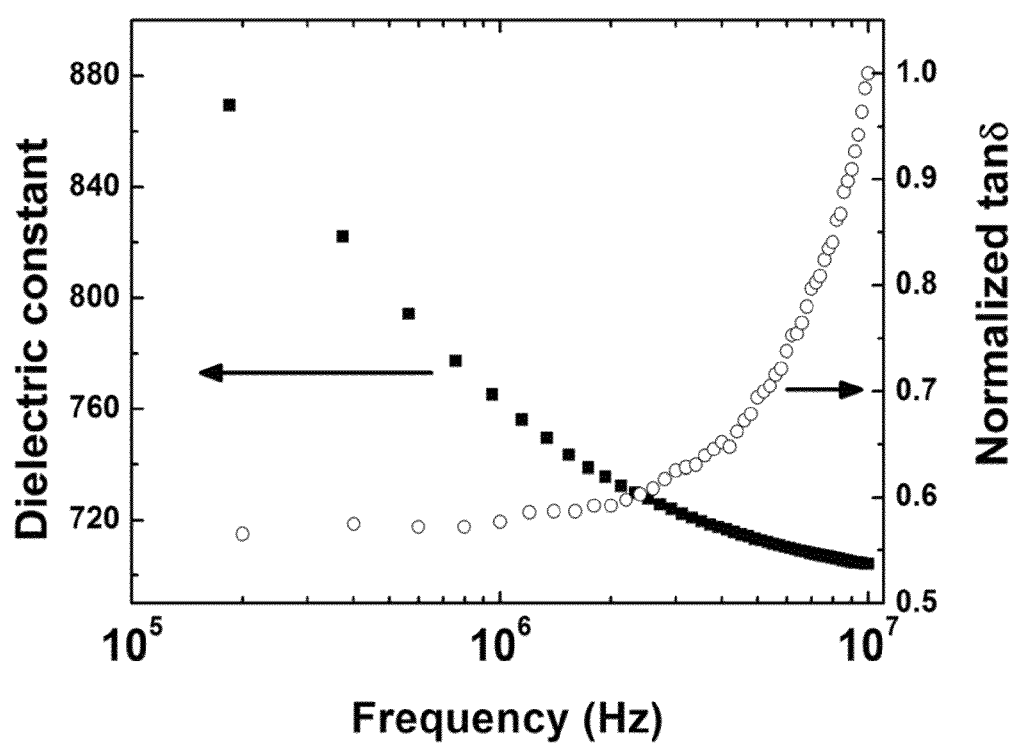
FIG. 5 is a graph showing the dielectric constant and normalized dissipation factor of the layer of BST as a function of frequency for the BST/STO/GaAs heterostructure according to the first exemplary embodiment of the presently claimed invention.

In FIG. 5, the dielectric constant and normalized dissipation factor (tanδ) of the BST layer deposited on the STO/GaAs are plotted as a function of frequency at room temperature. The relative permittivity of the BST layer decreases with an increasing frequency. The dielectric loss of the layer is found to be varied throughout the whole measured frequency.

Figure 6:
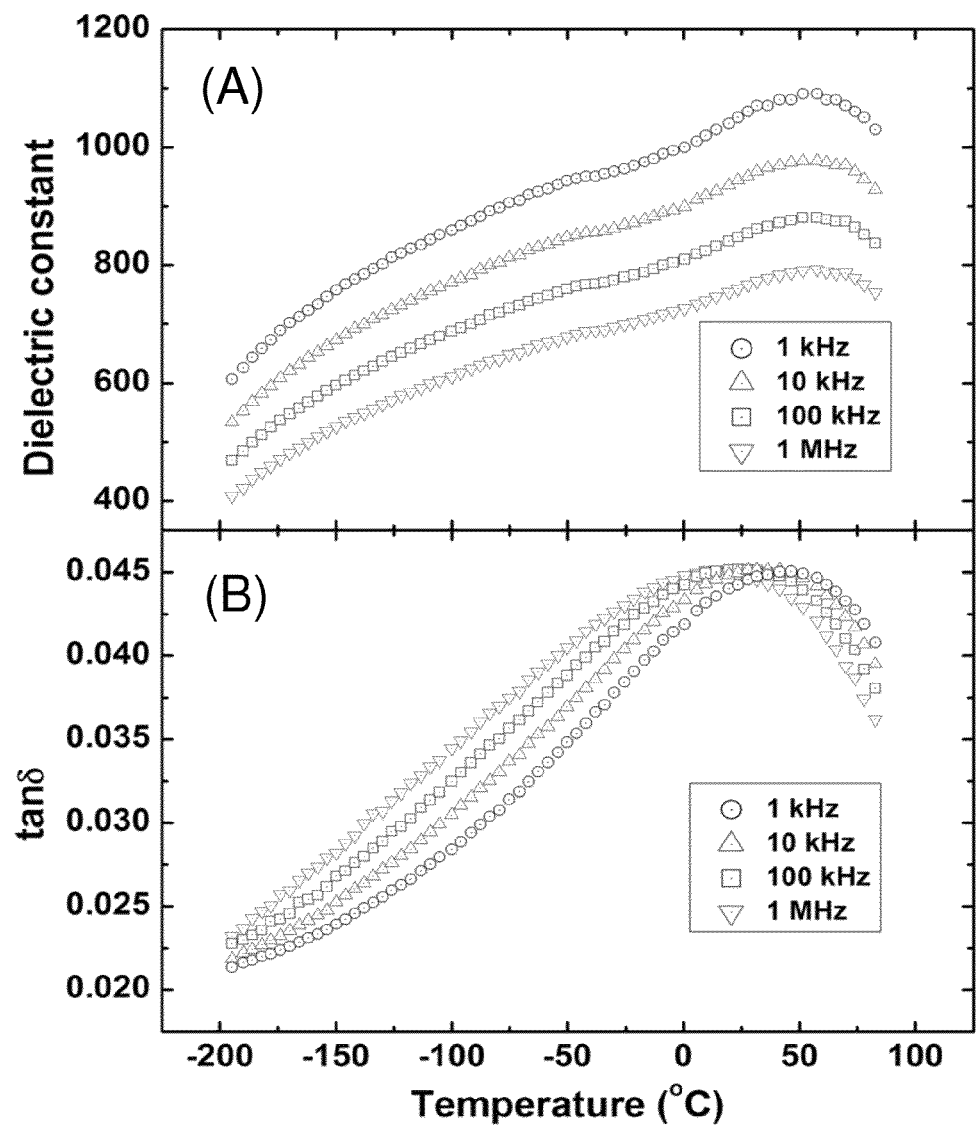
FIG. 6A is a graph showing the temperature-dependent in-plane dielectric constant ε of the layer of BST as a function of temperature for the BST/STO/GaAs heterostructure according to the first exemplary embodiment of the presently claimed invention.
FIG. 6B is a graph showing the dielectric loss of the layer of BST as a function of temperature for the BST/STO/GaAs heterostructure according to the first exemplary embodiment of the presently claimed invention.

FIG. 6A shows the temperature-dependent in-plane dielectric constant c of the BST layer. The measurement is conducted at four different frequencies as 1 kHz, 10 kHz, 100 kHz, and 1 MHz. The maximum dielectric constant at these four frequencies is found to be 1100, 980, 900, and 780, respectively. Almost the same value of Curie temperature ($T_c$) point is demonstrated for these four measuring frequencies, which exhibits from curves at $T_c$ close to 52° C. The obtained value is about 19° C. higher than that of the bulk BST material ($T_c$=33° C.). The mechanism of shift in $T_c$ of the BST layer along the in-plane direction is attributed to the effect of in-plane tensile strain induced by the lattice misfit. The in-plane strain (s) of the BST layer can be calculated by using an equation $s=(a_\parallel-a_0)/a_0$, where $a_\parallel$ is the lattice parameter of the BST layer and $a_0$ is the lattice parameter of bulk BST. Based on the lattice parameters, XRD results are used for calculation, and the value of s is found to be 0.68%. It should be noted that the shift in $T_c$, of the BST/STO/GaAs heterostructure of the present invention is not as significant as that observed in BST thin film grown on other substrates. Possible explanations for the difference could be (1) the compressive strain induced by the STO buffer layer is gradually relaxed as the layer thickness increases, and (2) the oxygen deficiency in the heterostructure. Another possible cause for the shift of Curie temperature might be due to the deviated ratio of Ba/Sr.

The corresponding loss tangent data are presented in FIG. 6B. The value of tanδ is found to be dependent on the temperature and frequency, ranging from 0.021 to 0.045.

Figure 7:
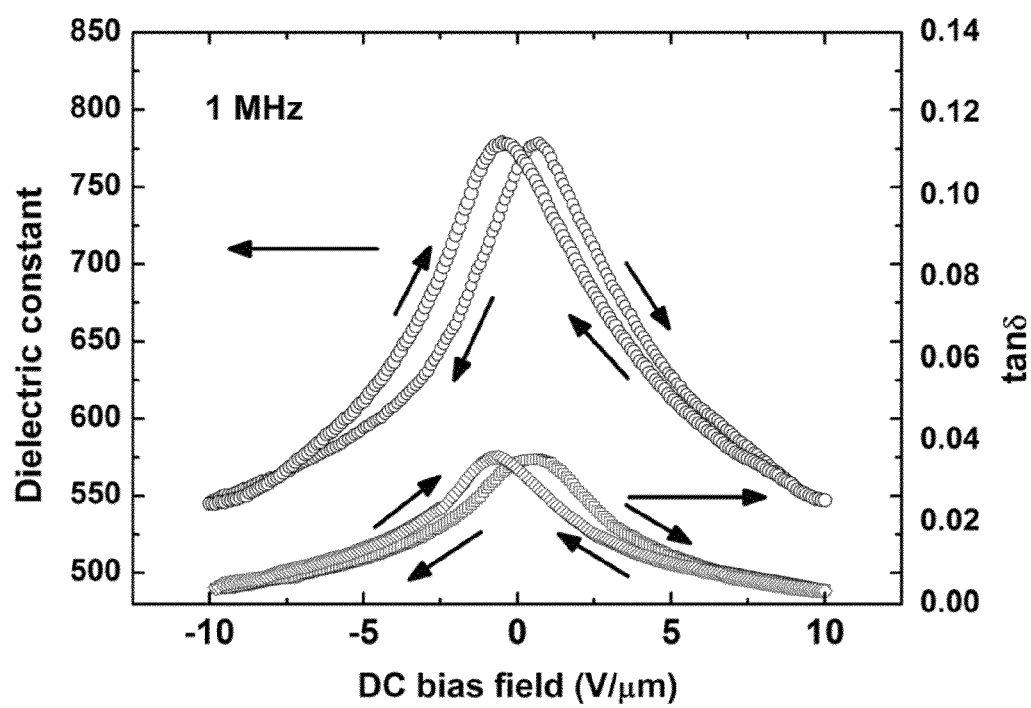
FIG. 7 is a graph showing in-plane room-temperature dielectric constant and loss of the layer of BST as a function of DC bias electric field at 1 MHz according to the first exemplary embodiment of the presently claimed invention.

To examine the feasibility of making tunable devices by combining the frequency agile electronics of BST with the high-performance microwave capabilities of GaAs, the electric-field dependence of the dielectric constant and loss for a 300 nm BST layer on STO/GaAs is measured. As shown in FIG. 7, the heterostructure exhibits a butterfly-shaped ε-E and tanδ-E dependence at room temperature. The electric field $E_m$, at which ε is a maximum, is found to be 0.7V/μm. The maximum in-plane dielectric tunability is calculated to be 30% at 1 MHz under a moderate electric field of 10V/μm by the following equation:

$$\frac{\Delta \varepsilon}{\varepsilon} = \frac{\varepsilon(0) - \varepsilon(E_{max})}{\varepsilon(0)}$$

where ε(0) and ε($E_{max}$) are the dielectric constants under the zero field and maximum electrical field, and ε(0) is found to be 778 and ε($E_{max}$) is found to be 547, based on the results from FIG. 7.

The dielectric loss at zero field is relatively higher, which may be explained by the ferroelectric phase induced by the strain. The commonly used figure of merit for the quality of frequency and phase agile materials is a simple approach for relating the tunability and dielectric loss in a tunable material, the so-called K factor defined as:

$$K = \frac{\varepsilon(0) - \varepsilon(E_{max})}{\varepsilon(0)} \frac{1}{(\tan\delta)_{max}}$$

where $(\tan\delta)_{max}$ is the maximum loss under all the applied fields.

The K factor at room temperature is obtained to be around 8 based on the result in FIG. 7. The results obtained from the heterostructure of the present invention are superior than the performance measured from BST layer grown on high resistivity Si substrate.

In accordance with a second exemplary embodiment of the presently claimed invention, a BST/STO/GaAs heterostructure is formed by the below method.

A BST/STO/GaAs (001) heterostructure is formed by O$_2$ flowing pulsed laser MBE system with an operation wavelength of KrF ($\lambda$=248 nm). A STO layer with the thickness of 10 nm is firstly deposited on GaAs (001) substrates. The distance between target and the substrate is 5 cm. The deposition temperature is set at 600° C. for STO layer grown on a GaAs substrate. To prevent oxidation of GaAs, the chamber is evacuated to a base pressure of 5×10$^{-5}$ Pa during the STO layer deposition. Then, a ceramic BST target with formula Ba$_{0.7}$Sr$_{0.3}$TiO$_3$ is used so as to form a Ba$_{0.7}$Sr$_{0.3}$TiO$_3$ layer later on. The buffered GaAs is heated to 650° C. and the subsequent BST layer is grown under a flowing O$_2$ atmosphere of 1 Pa. The deposition time is 2 hr, and the laser repetition rate is 3 Hz. The thickness of the BST layer is 300 nm After deposition, the heterostructure is then in situ annealed in ambient of 200 Pa oxygen partial pressure for 1 h before being cooled down to room temperature in order to reduce the oxygen vacancies.

Figure 8:
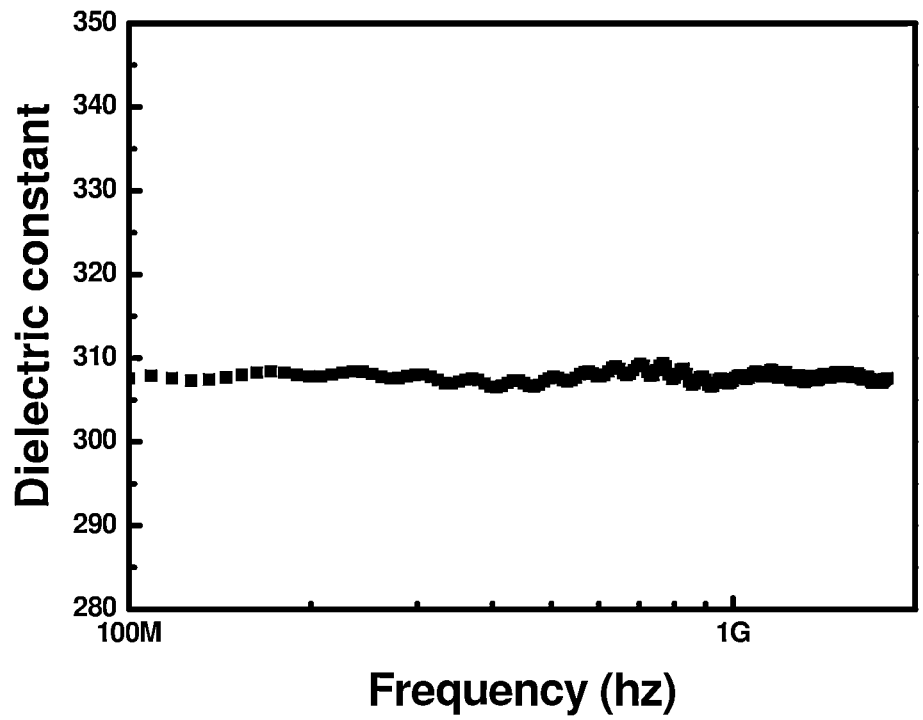
FIG. 8 is a graph showing dielectric constant of a layer of BST of 300 nm as a function of frequency from 100 M to 1.8 GHz at room temperature according to a second exemplary embodiment of the presently claimed invention.
Figure 9:
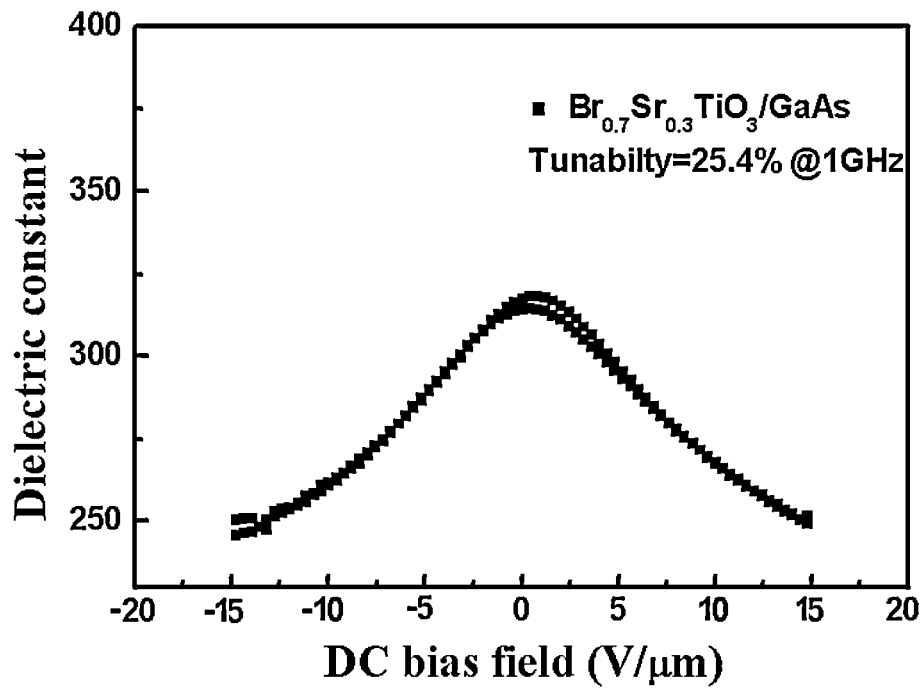
FIG. 9 is a graph showing in-plane room-temperature dielectric constant of the BST/STO/GaAs as a function of electric field at the frequency of 1 GHz according to the second exemplary embodiment of the presently claimed invention.

Microwave dielectric character of the BST/STO/GaAs has been investigated by RF impedance/material analyzer provided by HP company with model no. HP 429 lb with Cascade probe station, and the results are shown in FIG. 8 and FIG. 9. The interdigital electrode (IDE) configuration is 21 pairs of fingers in total with a finger length of 925 µm, finger width of 5 µm, and finger gap of 2 µm.

The dielectric constant of the BST layer deposited on STO/GaAs is plotted as a function of frequency from 100 M to 1.8GHz in FIG. 8. As shown in FIG. 8, as compared with dielectric constant of the BST/STO/GaAs measured at low frequency, the dielectric constant of BST/STO/GaAs decreases dramatically, which almost remains the same value of about 310 with the increase of frequency from 100 MHz to 1.8 GHz.

FIG. 9 shows the dielectric constant as a function of applied positive voltage at the frequency of 1 GHz. The maximal dielectric constant of 320 can be obtained at the bias voltage of 0V. As a result, a maximum in-plane dielectric tunability can be calculated to be about 25.4% at 1 GHz under a moderate electric field of 15V/µm.

The dielectric tunable capacitor based on the high quality epitaxial BST/STO/GaAs heterostructure developed by the present invention has been demonstrated to have a good temperature stability, high dielectric constant and low dielectric loss. The dielectric tunability at microwave frequency makes these heterostructure capacitors have potential commercial value for a variety of consumer electronics such as microwave varactors and phase shifter in monolithic microwave integrated circuit (MMIC). For example, today's wireless handset has the needs for electronically scanned antennas. The main component of these antennas is the RF phase shifter. The phase shifter technology used tunable ferroelectric capacitor based on BST/STO/GaAs heterostructure in the present invention can function at microwave, and the dielectric constant can be tuned by more than 30% at the microwave frequency, when operating in the range of 800 MHz/1800 MHz mostly used for global system of mobile (GSM) communication. Moreover, the products based on these BST/STO/GaAs heterostructure are significantly less expensive than conventional semiconductor based technology and ferroelectric/oxide wafer, which can greatly reduce costs for phased arrays. The phase shifter circuit is typically a large portion of the cost of phased array antenna systems. Consequently, tunable microwave devices based on BST-GaAs monolithic integrated system of the present invention will reduce circuit size, cost, and power consumption, and enhance the performance of microwave system.

By design of the pattern of interdigital capacitor (IDC) electrode, and combined with lithography, the size of the microwave dielectric tunable BST/STO/GaAs heterostructure becomes small, which is suitable for integration with Monolithic Microwave Integrated Circuit (MMIC). Accordingly, the finger gap and length of the IDE should be precisely and correctly designed according to the device requirement based on different material properties, especially on microwave. Preferably, according to the presently claimed invention, the pattern of inter-digital electrodes formed on the BST/STO/GaAs heterostructure of the present invention for ferroelectric capacitor possesses a total of 21 fingers with a finger length of 925 µm, finger width of 5 µm, and finger gap of 2 µm.

The foregoing description of the present invention has been provided for the purposes of illustration and description. It is not intended to be exhaustive or to limit the present invention to the precise forms disclosed. Many modifications and variations will be apparent to the practitioner skilled in the art.

The embodiments are chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

What is claimed is:

1. A method for fabricating a barium strontium titanate/strontium titanate/gallium arsenide (BST/STO/GaAs) heterostructure, comprising:
    providing a GaAs substrate;
    growing epitaxially at least one monocrystalline layer of STO on a surface of the GaAs substrate by a first laser molecular beam epitaxial (MBE) system; and
    growing epitaxially at least one monocrystalline layer of BST on top of the monocrystalline layer of STO by a second laser MBE system.

2. The method of claim 1, wherein the first laser MBE system includes an oxygen flowing pulsed laser molecular beam epitaxial system with an operation wavelength of 248 nm.

3. The method of claim 2, wherein said growing epitaxially at least one monocrystalline layer of STO on the surface of the GaAs substrate by the first laser MBE system is performed at a temperature from 580° C. to 600° C.

4. The method of claim 3, wherein said growing epitaxially at least one monocrystalline layer of STO on the surface of the GaAs substrate by the first laser MBE system is performed at a base pressure from $1 \times 10^{-5}$ to $5 \times 10^{-5}$ Pa.

5. The method of claim 4, wherein said growing epitaxially at least one monocrystalline layer of STO on the surface of the GaAs substrate by the first laser MBE system is performed at a growth rate from 3 to 5 nm/min.

6. The method of claim 5, wherein the second laser MBE system includes an oxygen flowing pulsed laser molecular beam epitaxial system with an operation wavelength of 248 nm.

7. The method of claim 6, wherein said growing epitaxially at least one monocrystalline layer of BST on top of the monocrystalline layer of STO by the second laser MBE system is performed at a temperature from 620° C. to 650° C.

8. The method of claim 7, wherein said growing epitaxially at least one monocrystalline layer of BST on top of the monocrystalline layer of STO by the second laser MBE system is performed at an oxygen partial pressure from 1 to 20 Pa.

9. The method of claim 8, wherein said growing epitaxially at least one moncrystalline layer of BST on top of the monocrystalline layer of STO by the second laser MBE system is performed at a growth rate from 5 to 10 nm/min.

10. The method of claim 9, wherein the moncrystalline layer of BST comprises $Ba_{1-x}Sr_xTiO_3$, and x is from 0.3 to 0.5.

11. The method of claim 9, wherein the moncrystalline layer of BST comprises $Ba_{0.7}Sr_{0.3}TiO_3$.

12. The method of claim 1, further comprising:
annealing the BST/STO/GaAs heterostructure at ambient temperature and at an oxygen partial pressure from 100-300 Pa after said growing epitaxially at least one monocrystalline layer of BST on top of the monocrystalline layer of STO by the second laser MBE system.

13. A barium strontium titanate/strontium titanate/gallium arsenide (BST/STO/GaAs) heterostructure fabricated by the method of claim 1 comprising:
a GaAs substrate;
at least one monocrystalline layer of STO grown on a surface of the GaAs substrate; and
at least one monocrystalline layer of BST grown on top of the monocrystalline layer of STO.

14. The BST/STO/GaAs heterostructure of claim 13, wherein thickness of the monocrystalline layer of STO is from 3 nm to 25 nm.

15. The BST/STO/GaAs heterostructure of claim 14, wherein the monocrystalline layer of BST comprises $Ba_{1-x}Sr_xTiO_3$, and x is from 0.3 to 0.5.

16. The BST/STO/GaAs heterostructure of claim 15, wherein the BST/STO/GaAs heterostructure comprises an in-plane layer-substrate orientation of [100 ]BST||[100] STO||[110]GaAs, or an out-of-plane layer-substrate orientation of [001]BST||[001]STO||[001]GaAs.

17. The BST/STO/GaAs heterostructure of claim 16, wherein thickness of the monocrystalline layer of BST is from 200 nm to 500 nm.

18. A tunable ferroelectric device comprising the BST/STO/GaAs heterostructure of claim 13.

19. The device of claim 18 is selected from a microwave varactor, phase shifter, or tunable ferroelectric capacitor.

20. The device of claim 19, wherein the tunable ferroelectric capacitor comprises at least one interdigital capacitor electrode comprising twenty-one pairs of fingers, each of said fingers having a finger length of 925 μm, finger width of 5 μm, and finger gap of 2 μm.

* * * * *